United States Patent
Itano et al.

(10) Patent No.: US 7,196,424 B2
(45) Date of Patent: Mar. 27, 2007

(54) SEMICONDUCTOR DEVICE

(75) Inventors: Noriyuki Itano, Akishima (JP); Kinya Mitsumoto, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 29 days.

(21) Appl. No.: 10/982,920

(22) Filed: Nov. 8, 2004

(65) Prior Publication Data

US 2005/0104175 A1 May 19, 2005

(30) Foreign Application Priority Data

Nov. 14, 2003 (JP) ............................. 2003-385743

(51) Int. Cl.
*H01L 23/48* (2006.01)

(52) U.S. Cl. ............... 257/776; 257/678; 257/E27.098; 365/194; 365/233

(58) Field of Classification Search ............... 365/194, 365/233, 189.12, 236; 327/158; 257/678, 257/776, E27.098
See application file for complete search history.

(56) References Cited

U.S. PATENT DOCUMENTS 6,556,489 B2 * 4/2003 Gomm et al. ............... 365/194
6,653,875 B2 * 11/2003 Partsch et al. .............. 327/158

FOREIGN PATENT DOCUMENTS

JP  2000-231421  11/1999

* cited by examiner

*Primary Examiner*—Andy Huynh
(74) *Attorney, Agent, or Firm*—Reed Smith LLP; Stanley P. Fisher, Esq.; Juan Carlos A. Marquez, Esq.

(57) ABSTRACT

A semiconductor device with a packaging circuit portion connected to a semiconductor chip therein. The semiconductor chip includes a plurality of pad electrodes, and the packaging circuit portion includes wiring connected to the pad electrodes on the semiconductor chip, mounting terminals, and a first signal path for receiving a signal output from the predetermined one of the pad electrodes and transmitting the signal to other one of the pad electrodes. The first signal path includes delay elements comparable to delays in a second signal path extending from the predetermined one of the mounting terminals to the other one of the mounting terminals through the semiconductor chip, and is disposed on a feedback path for phase comparison for synchronizing the phase of an output signal from the second signal path to the phase of an input signal to the second signal path.

7 Claims, 10 Drawing Sheets

SEMICONDUCTOR DEVICE

INCORPORATION BY REFERENCE

The present application claims priority from Japanese application JP2003-385743 filed on Nov. 14, 2003, the content of which is hereby incorporated by reference into this application.

BACKGROUND OF THE INVENTION

The present invention relates to a semiconductor device having a feedback loop for internal signal synchronization to an external signal. More specifically, the invention relates to a delay setting in the feedback loop. The invention relates to the delay time setting in the feedback loop in a clock synchronization circuit typified by a DLL (delay-locked loop) circuit, for example, and further relates to a technique that is effective for being applied to clock reproduction for reproducing the phase of an input clock signal for use as the phase of an output clock signal.

Clock synchronization memories such as a synchronous DRAM have a DLL circuit. In the DLL circuit, an external clock signal is delayed by predetermined cycles, thereby reproducing the phase of an input clock signal for use as the phase of an output clock signal. Then, using the clock reproduction, an output timing of read data is synchronized with the phase of the output clock signal. The DLL circuit has the feedback loop for clock phase control. When the phase of the input clock signal is reproduced for use as the phase of the output clock signal, a delay circuit simulating a delay generated in an on-chip circuit configuration and a chip package should be provided for the feed back loop, and then feedback control of a phase difference between a feedback clock signal and a reference clock signal in the feedback loop should be exercised. In order to reproduce the phase of the input clock signal for use for the output clock signal, it becomes necessary to consider compatibility between the synchronization circuit and delay components caused by inductance components such as those of bonding pads, wires, bump electrodes, and leads and electrostatic capacitance components as well. In the circuit that simulates these delay components, an error from an actual delay might be generated due to the influence of variations in the semiconductor processing technology and changes in the temperature of the devices of the circuit. JP-A-2000-231421 discloses a technique for providing an off-chip driver, a clock receiver, and wiring in the feedback loop to simulate a system clock delay.

SUMMARY OF THE INVENTION

In high-speed SRAMs for communications applications, in order to implement a high-speed operation, it has been mainstream to mount the DLL circuit inside the SRAM. In order to achieve the high-speed operation required by the user, there is the need for increasing the accuracy of the DLL circuit. For this reason, the inventors of the present invention have studied the feedback loop of the DLL circuit so as to perform delay control with a high precision by the DLL circuit. Based on the study, the inventor has found importance of matching a delay in the feedback loop of the DLL circuit with a delay from an external clock input terminal to an external clock output terminal with a high precision. JP-A-2000-231421 does not clarify such importance of matching.

An object of the present invention is therefore to provide a semiconductor device that can match a delay in a feedback path with a delay from an external clock input terminal to an external clock output terminal with a high precision.

The above and other objects and novel features of the present invention will be made clear from a description of the specification and the appended drawings.

A brief description of an overview of typical ones of the inventions disclosed in the present application is as in the following.

The following is a brief description of effects that can be obtained from the typical ones of the inventions disclosed in the present application.

[1] According to one aspect of the present invention, in a semiconductor device with a packaging circuit portion connected to a semiconductor chip, the semiconductor chip includes a plurality of pad electrodes; and the packaging circuit portion includes:

wiring connected to the pad electrodes on the semiconductor chip;

a plurality of mounting terminals; and a first signal path for receiving a signal output from a predetermined one of the pad electrodes and transmitting the signal to other one of the pad electrodes. The first signal path includes delay elements comparable to a delay in the first portion of a second signal path from a predetermined one of the mounting terminals to one of the pad electrodes for input on the semiconductor chip and a delay in the second portion of the second signal path from one of the pad electrodes for output on the semiconductor chip to other one of the mounting terminals, and is disposed on a feedback path for phase comparison for synchronizing the phase of an output signal from the second signal path to the phase of an input signal to the second signal path, the second signal path extending from the predetermined one of the mounting terminals to the other one of the mounting terminals through the semiconductor chip.

According to the semiconductor device described above, the feedback path includes the delay elements comparable to the delay in the first portion of the second signal path from the predetermined one of the mounting terminals to the one of the pad electrodes for input on the semiconductor chip and the delay in the second portion of the second signal path from the one of the pad electrodes for output on the semiconductor chip to the other one of the mounting terminals, the second signal path extending from the predetermined one of the mounting terminals to the other one of the mounting terminals through the semiconductor chip. Thus, even if there are variations in the manufacturing process and changes in temperature, the phase of an input clock signal to one mounting terminal can be reproduced and then used as the phase of an output clock signal from other mounting terminal. In other words, a match between the delay in the feedback path and the delay generated from the clock input mounting terminal to the clock output mounting terminal with high precision can be made.

According to a specific embodiment of the present invention, the first signal path is a replica circuit simulating a delay element in the first portion and a delay element in the second portion. Further, the semiconductor chip includes a clock synchronization circuit connected to the first portion, the second portion, and the first signal path, respectively, and the clock synchronization circuit delays the clock signal output from the mounting terminal on the second portion by predetermined cycles with respect to the signal received at the mounting terminal on the first portion, for phase synchronization.

Assuming a conductor device such as a flip chip, the semiconductor chip includes:

a semiconductor substrate;

a plurality of circuit elements formed on an element formation layer on the semiconductor substrate; and a plurality of pad electrodes formed on the surface of the element formation layer and connected to predetermined ones of the circuit elements. The packaging circuit portion includes a conductive layer connected to the predetermined ones of the pad electrodes and extending on the element formation layer, and the mounting terminals are bump electrodes connected to the conductive layer. In this case, the first signal path includes a predetermined conductive layer for connecting the predetermined one of the pad electrodes and the other one of the pad electrodes, and lands for the bump electrodes are formed in parts of the conductive layer.

Assuming the semiconductor device with the flip chip mounted on a single-layer or a multi-layer wiring substrate, the semiconductor chip includes:

a semiconductor substrate;

a plurality of circuit elements formed on an element formation layer on the semiconductor substrate; and a plurality of pad electrodes formed on the surface of the element formation layer and connected to predetermined ones of the circuit elements. The packaging circuit portion includes:

a conductive layer connected to the predetermined ones of the pad electrodes and extending on the element formation layer;

bump electrodes formed over the conductive layer;

single-layer or multi-layer wiring and through holes connected to the bump electrodes; and ball electrodes connected to predetermined ones of the single-layer wiring or the multi-layer wiring, for use as the mounting terminals. In this case, the first signal path includes:

a predetermined conductive layer;

the bump electrodes connected to the predetermined conductive layer; and the single-layer or multi-layer wiring and the through holes connected to the bump electrodes. Lands for the ball electrodes are formed in parts of the single-layer or multi-layer wiring.

[2] A semiconductor device according to a second aspect of the present invention includes:

a semiconductor chip; and a packaging circuit portion including external connecting terminals for mounting and wiring paths for connecting the external connecting terminals to corresponding terminals on the semiconductor chip, formed thereon. The packaging circuit portion includes a specific delay path for receiving a signal from the semiconductor chip and outputting the signal to the semiconductor chip. The specific delay path does not receive the signal from any of the external connecting terminals nor output the signal to any of the external connecting terminals. The specific delay path is disposed on a feedback path for phase comparison, for synchronizing the phase of an output signal from the predetermined one of the external connecting terminals to the phase of an input signal to other predetermined one of the external connecting terminals.

According to the semiconductor device described above, the specific delay path is caused to simulate predetermined signal propagation delays between the external connecting terminals of the packaging circuit portion and the semiconductor chip, and the specific delay path is included in the feedback path for phase comparison. Thus, when the phase of an output signal from the predetermined one of the external connecting terminals is synchronized to the phase of an input signal to other predetermined one of the external connecting terminals, the characteristics of the specific delay path also track variations in the predetermined signal propagation delays caused by variations in the manufacturing process and changes in temperature. A match between the delay in the feedback path and the delay generated from the clock input mounting terminal to the clock output mounting terminal with high precision therefore becomes possible. Accordingly, synchronization of the phase of an output signal from the predetermined one of the external connecting terminals to the phase of an input signal to other predetermined one of the external connecting terminals with high precision becomes possible.

According to a specific embodiment of the present invention, the specific delay path is a dummy signal path for simulating the delay characteristics of predetermined signal paths on the packaging circuit portion. The dummy signal path simulates a clock propagation path from a clock input terminal as one of the external connecting terminals to the semiconductor chip and a clock propagation path from the semiconductor chip to a clock output terminal as other one of the external connecting terminals. The semiconductor chip further includes a delay-locked loop circuit connected to the dummy signal path and both of the clock propagation paths, and the delay-locked loop performs phase synchronization for delaying the phase of a clock signal output from the other one of the external connecting terminals by predetermined cycles with respect to a clock signal received at one of the external connecting terminals.

Assuming the conductor device such as the flip chip, the packaging circuit portion includes a conductive layer connected to pad electrodes on the semiconductor chip and extending on the semiconductor chip; and bump electrodes connected to the conductive layer, for use as the external connecting terminals.

Assuming the semiconductor device with the flip chip mounted on the single-layer or multi-layer wiring substrate, the packaging circuit portion includes:

a conductive layer connected to pad electrodes on the semiconductor chip and extending on the semiconductor chip;

bump electrodes connected to the conductive layer;

single-layer or multi-layer wiring and through holes connected to the bump electrodes; and ball electrodes connected to predetermined single-layer or multi-layer wiring, for use as the external connecting terminals.

[3] According to an aspect centering on a delay-locked loop circuit, a semiconductor device of the present invention includes:

a semiconductor chip having the delay-locked loop circuit formed on a semiconductor substrate: and a packaging circuit portion having external connecting terminals for mounting and wiring paths for connecting terminals of the semiconductor chip to corresponding ones of the external connecting terminals, formed thereon. The delay-locked loop circuit reproduces the phase of an input clock signal supplied from one of the external connecting terminals, for output as the phase of an output clock signal from other one of the external terminals, based on a result of phase comparison between the input clock signal and a delayed clock signal obtained by delaying the input clock signal by a delay circuit. The delay circuit is formed on the packaging circuit portion, and constitutes a replica circuit for simulating a delay element from the one of the external connecting terminals for receiving the clock signal to the semiconductor chip and a delay element from the semiconductor chip to the other one of external connecting terminals for outputting the output clock signal.

Other objects, features and advantages of the invention will become apparent from the following description of the embodiments of the invention taken in conjunction with the accompanying drawings.

DESCRIPTION OF THE EMBODIMENTS

Figure 2:
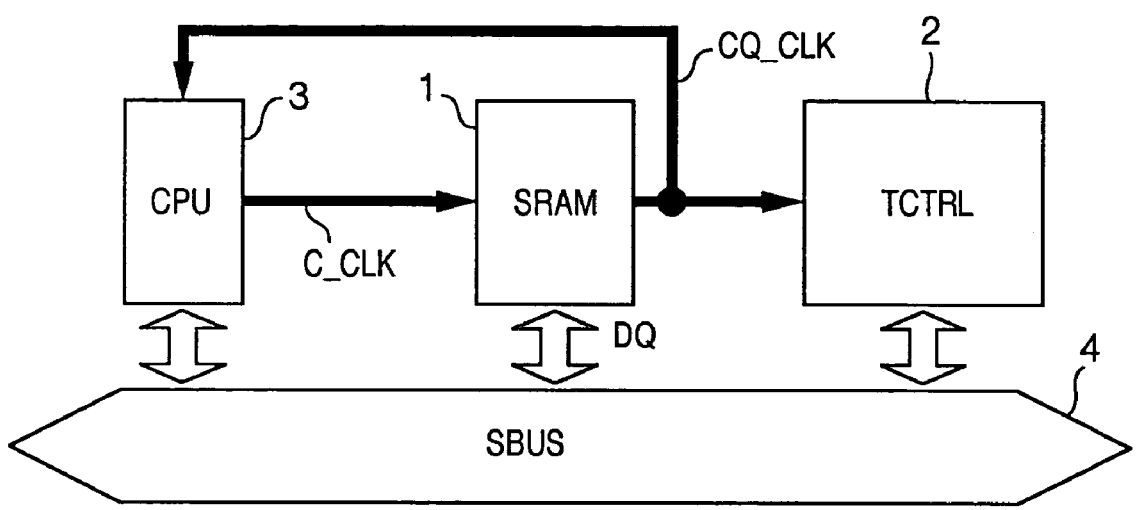
FIG. 2 is a block diagram illustrating a data processing system using the SRAM in FIG. 1.

FIG. 2 illustrates a data processing system using an SRAM (static random access memory) 1 as an example of a semiconductor device according to the present invention. The data processing system shown in FIG. 2 includes the SRAM 1, a communication controller (TCTRL) 2 constituting part of a router, for example, and a CPU (central processing unit) 3, which are shown typically. These units are connected in common to a system bus (SBUS) 4. The SRAM 1 has a clock reproducing function of reproducing the phase of an input clock for use as the phase of an output clock. The input clock is a clock signal C_CLK such as a system clock signal output from the CPU 3, and the output clock is a clock signal CQ_CLK, for example. The clock signal CQ_CLK is supplied to the CPU 3 and the TCTRL 2. The SRAM 1 is synchronized with the clock signal C_CLK. The CPU 3 and the TCTRL 2 can be informed of determination of read data on the system bus 4 or output of the read data to the system bus 4 in synchronization with a change in the clock signal CQ_CLK. The SRAM 1 includes a DLL circuit for fulfilling a clock reproducing function.

Figure 1:
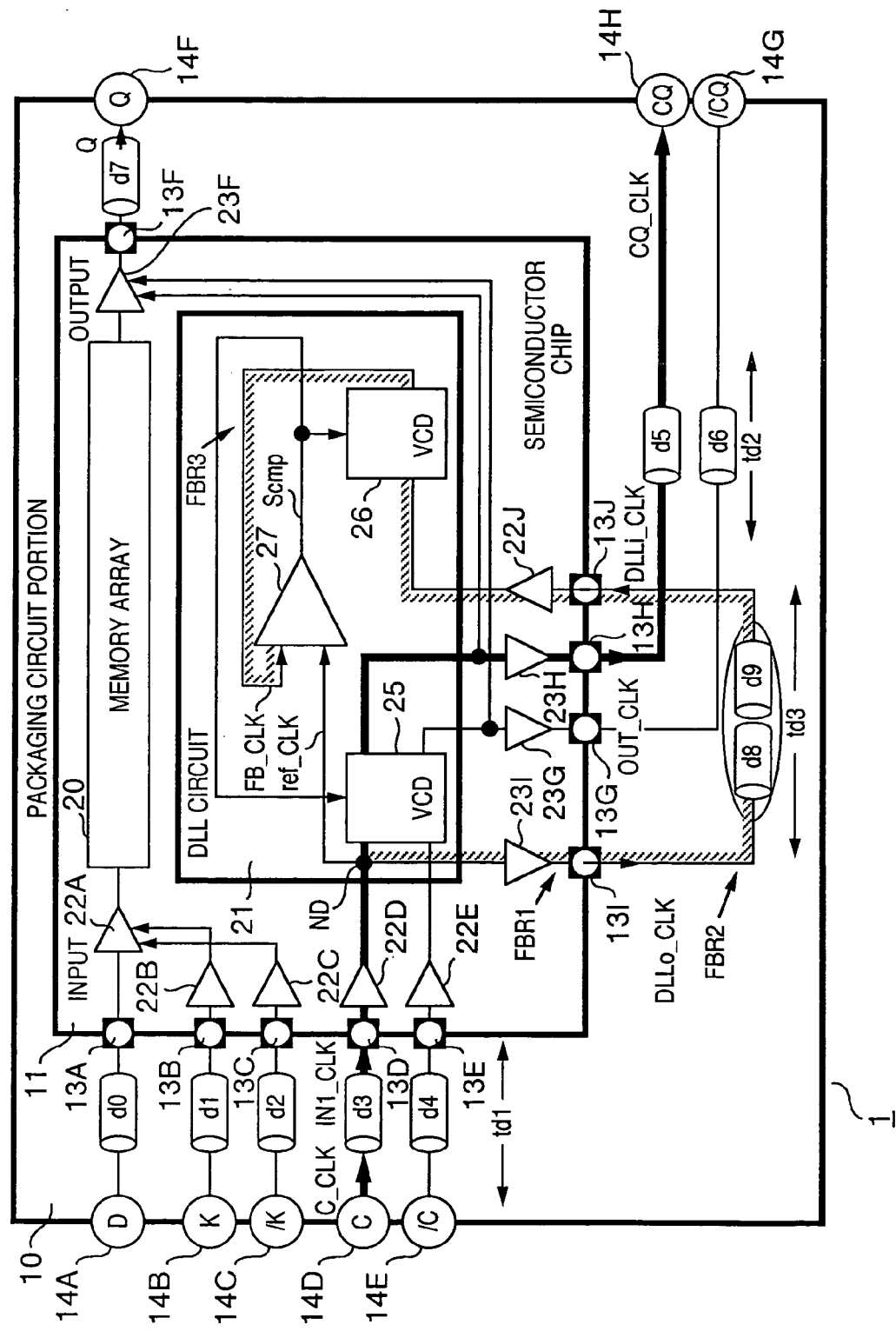
FIG. 1 illustrates a configuration of an SRAM, which is a semiconductor device according to the present invention, centering on a DLL circuit.

FIG. 1 illustrates a configuration of the SRAM 1 centering on the DLL circuit. Though no particular limitation is imposed on the SRAM 1, the SRAM 1 is constituted from an SRAM chip 11 as a semiconductor chip (pellet) and a packaging circuit portion (hereinafter also referred to as a package) 10 connected to the SRAM chip 11. Though details of the package 10 will be described hereinafter, a configuration for face down mounting is assumed herein. The SRAM chip 11 includes a plurality of pad electrodes 13A to 13J typified as external terminals. The package 10 includes external connecting terminals 14A to 14H as a plurality of mounting terminals for mounting the SRAM 1 on a mounting board (not shown). Reference characters D, K and /K, C and /C, Q, and CQ and /CQ indicated in the external connecting terminals 14A to 14G, respectively, denote a data input terminal, data input clock terminals, data output clock terminals, a data output terminal, and clock input terminals, respectively. A symbol/appended to a signal indicates that the signal is an inverted signal.

On the SRAM chip 11, a memory array 20, a DLL circuit 21, input buffers 22A to 22E, 22J, and output buffers 23F to 23I, which are shown typically, are formed.

Though a specific illustration of the memory array 20 is omitted, the memory array 20 includes a lot of static memory cells arranged in a matrix. Selection terminals of the memory cells are connected to corresponding word lines, and data input and output terminals of the memory cells are connected to corresponding bit lines. The bit lines are selectively conducted to common data lines through a column switch circuit, for activation. A sense amplifier and a write amplifier are connected to the common data lines. The sense amplifier senses data read from a memory cell and supplies the read data to the output buffer 23F. Write data is supplied from the input buffer 22A to the write amplifier. Selection of a word line and a column switch is performed using a signal that decodes an address signal input to an address input buffer of which illustration is omitted. Illustration of input paths for a strobe signal and the address signal for chip selection is omitted. Read and write operation controls are performed based on a timing signal generated by a timing controller of which illustration is omitted. The DLL circuit 21 herein defines a data output timing during the read operation control by the timing controller not shown.

The DLL circuit 21 includes variable delay circuits (VCD) 25 and 26 and a phase comparator 27, which are typically shown. The clock signal C_CLK from the external connecting terminal 14D is transmitted to one variable delay circuit 25, and is delayed according to a comparison result signal Scmp indicating the result of a comparison output from the phase comparator 27. The delayed clock signal is transmitted to the external connecting terminal 14H and output as the clock signal CQ_CLK. A signal path from the external connecting terminal 14D to the external connecting terminal 14H is positioned as a second signal path. The phase comparator 27 detects a phase difference of a feedback clock signal FB_CLK from a reference clock signal ref_CLK. The reference clock signal ref_CLK is used as a clock for an input node ND of the variable delay circuit (VCD) 25. The feedback clock signal FB_CLK propagates through feedback paths FBR1, FBR2, and FBR3 from the input node ND. The feedback path FBR1 indicates the path from the input node ND to pad electrode 13I, the feedback path FBR2 indicates the path from the pad electrode 13I to pad electrode 13J, and feedback path FEBR3 indicates the path from the pad electrode 13J to the input terminal of the phase comparator 27 through the variable delay circuit (VCD) 26. The feedback path FBR 2 is positioned as a first signal path.

The feedback paths FBR1 and FBR3 are constituted as a replica circuit within the chip (an on-chip replica circuit) simulating delay elements or delay components in a path from the pad electrode 13D to the pad electrode 13H through the VCD 25 inside the SRAM chip 11. In short, the buffer 23I is positioned as a replica buffer corresponding to the buffer 23H, and the buffer 22J is positioned as a replica buffer corresponding to the buffer 22D. The VCD 26 has the same circuit configuration as the VCD 25, and is positioned as a replica circuit subject to the same variable delay control as the VCD 25 according to the comparison result signal Scmp. Wiring resistances, parasitic capacitances that exist in the wiring, and inductance components in the wiring of the feedback paths FBR1 and FBR3 are set to be comparable to those in the path from the pad electrode 13D to the pad electrode 13H through the VCD 25.

The feedback path FBR2 is constituted as a replica circuit (an on-package replica circuit) simulating delay elements or delay components in a path from the external connecting terminal 14D to the pad electrode 13D on the package 10 (a first portion of the second signal path) and delay elements or delay components in a path from the pad electrode 13H to the external connecting terminal 14H (a second portion of the second signal path). The delay elements or the delay components correctively refer to wiring resistances, parasitic capacitances in wiring, and inductance components in the wiring. When a delay time caused by the delay elements in the path from the external connecting terminal 14D to the pad electrode 13D (first portion of the second signal path) is indicated by td1, and a delay time caused by the delay elements in the path from the pad electrode 13H to the external connecting terminal 14H (second portion of the second signal path) is indicated by td2, a delay time td3 in the feedback path (first signal path) FBR 2 is indicated by td3=td1+td2. Incidentally, elements d0 to d9 drawn as cylindrical figures on the wiring for the packaging circuit portion 10 represent delay elements caused by the wiring resistances, parasitic capacitances in the wiring, and inductances in the wiring. For, example, the element d3 represents the delay elements that exit in the wiring between the external connecting terminal 14D and the pad electrode 13D. The element d5 represents the delay elements that exist between the pad electrode 13H and the external connecting terminal 14H. The elements d8 and d9 indicate the delay elements that exist in the feedback path FBR2 (first signal path) between the pad electrode 13I and the pad electrode 13J. Thus, the delay time of the delay element d3 is indicated by td1, and the delay time of the delay element d5 is indicated by td2. The delay time of the delay elements d8 and d9 is indicated by td3, which is equal to the sum of td1 and td2.

By giving the delay time caused by the on-chip replica circuit constituted from the feedback loop FBR1 and FBR3 and the delay time caused by the on-package replica circuit constituted from the feedback path FBR2 to the feedback clock signal FB_CLK, the phase of the reference clock signal ref_CLK is aligned with the phase of the feedback clock signal FB_CLK. The phase of the clock signal C_CLK input to the external connecting terminal 14D is thereby reproduced to be used for the output clock signal CQ_CLK of the external connecting terminal 14H, and the rise timing of the clock signal C_CLK is matched or substantially matched with the rise timing of the clock signal CQ_CLK. The number of clock cycles from input of the clock signal C_CLK to the reproduction for the clock signal CQ_CLK is determined by the number of cycles of the clock signal C_CLK set to be the delays by the variable delay circuits 25 and 26 when the phase of the reference clock signal ref_CLK has matched the phase of the feedback clock signal FB_CLK. To take an example, assume that the clock signal CQ_CLK appears at the external connecting terminal 14H after two cycles of the clock signal C_CLK from input of the clock signal C_CLK to the external connecting terminal 14D. An input to the output buffer 23H is used for output control of the output buffer 23F. Data output from the output buffer 23F is thus output from the pad 13F at the same timing as that for the output clock signal OUT_CLK output from the pad 13H. The delay time caused by the delay elements that exist from the pad electrode 13F to the external connecting electrode 14F is set approximately to td2, so that a change in data output from the external connecting terminal 14F is generated in synchronization with the timing of a change in the clock signal output from the external connecting terminal 14H.

Figure 3:
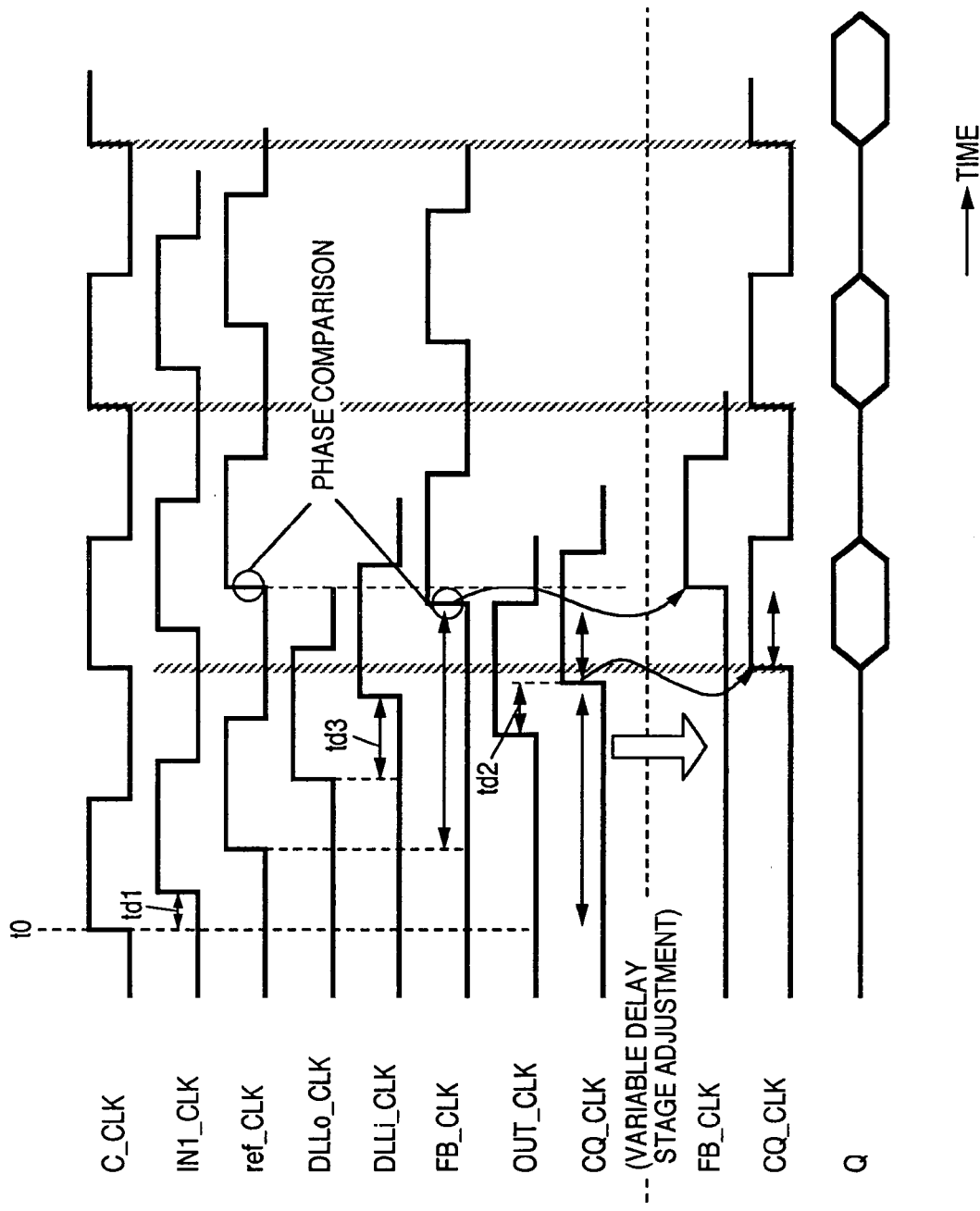
FIG. 3 is a timing chart illustrating timings of a clock reproducing operation or a clock synchronizing operation using the DLL circuit.

FIG. 3 illustrates timings of a clock reproducing operation or a clock synchronizing operation using the DLL circuit 21. When the clock signal C_CLK rises at the external connecting terminal 14D at time t0, a clock signal IN1_CLK rises at the pad electrode 13D after a delay time td1. Then, sequential delays occur, and in a clock output system, the reference clock signal ref_CLK rises, the clock signal OUT_CLK rises at the pad electrode 13H, and the clock signal CQ_CLK rises at the external connecting terminal 14H. In the feedback path, a clock signal DLLo_CLK rises at the pad electrode 13I, a clock signal DLLi_CLK rises at the pad electrode 13J, and the feedback clock signal FB_CLK rises. At the start of the operation, the phase of the reference clock signal ref_CLK is not aligned with the phase of the feedback clock signal FB_CLK. Thus, delay time control is performed by the variable delay circuits 25 and 26 so as to reduce a difference in the phases. The phase of the feedback clock signal FB_CLK is thus aligned with the phase of the reference clock signal ref_CLK. In this state, the feedback clock signal FB_CLK has delays in the feedback paths FBR1, FBR2, and FBR3 with respect to the reference clock signal ref_CLK. The delays become the sum of a delay caused by the on-chip replica circuit and a delay caused by the on-package replica circuit, which corresponds to the delay time required for a change in the clock signal at the external connecting terminal 14D to propagate to the external connecting terminal 14H. Accordingly, the phase of the clock signal C_CLK input to the external connecting terminal 14D is reproduced to be used for the clock CQ_CLK output from the external connecting terminal 14H. Likewise, read data having the same phase as the clock signal C_CLK is output from the external connecting terminal 14F.

As described above, in order to bring the delay in the path from the input terminal 14D for the clock signal C_CLK to the output terminal 14H for the clock signal CQ_CLK closer to the sum of the delays in the feedback paths FBR1, FBR2, and FBR3, the on-chip replica circuit having substantially the same circuit configuration is used for the delay generated in the circuit configuration on the SRAM chip 11, and the on-package replica circuit using dummy wiring is fabricated for the delay generated on the package 10. An example of the on-package replica circuit will be described below.

Figure 4:
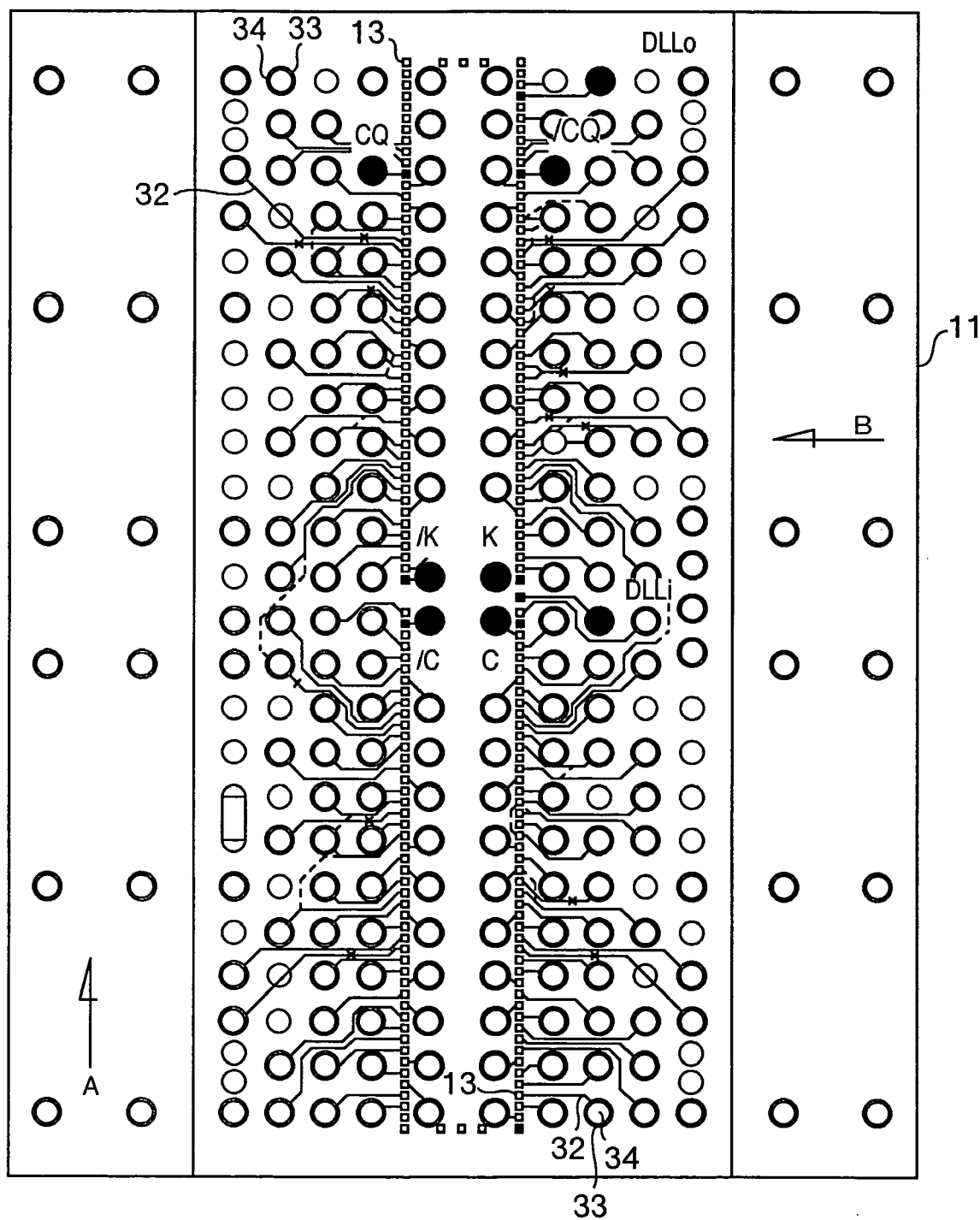
FIG. 4 is a plan view illustrating planar configurations of surfaces of pad electrodes on an SRAM chip in the form of a structure such as a flip chip.

FIG. 4 shows planar configurations of the surfaces of the pad electrodes on the SRAM chip 11 in the form of a structure such as a flip chip. The pad electrodes such as the pad electrode 13H are illustrated as small squares and disposed in the central portions of the chip. On the surface of the SRAM chip 11, the pad electrodes (collectively indicated by reference numeral 13) are exposed. Then, the surface is covered by an insulating film. A lot of comparatively large bump electrodes (collectively indicated by reference numeral 34) are disposed over a wide range in the form of concentric circles, and the pad electrodes 13 and the bump electrodes 34 corresponding to one another are connected via relocation wiring (collectively indicated by reference numeral 32), thereby forming the flip-flop structure. Small inner circles of the concentric circles shown as symbols for the bump electrodes 34 denote the bump electrodes 34, and large outer circles denote bump lands (collectively indicated by reference numeral 33) for mounting the bump electrodes 34, formed at the ends of the relocation wiring 32. A black circle with CQ denotes the bump electrode connected to the pad electrode 13H, a black circle with /CQ denotes the bump electrode connected to the pad electrode 13G, A black circle with DLLo denotes the bump electrode connected to the pad electrode 13I, a black circle with DLLi denotes the bump electrode connected to the pad electrode 13J, a black circle with C denotes the bump electrode connected to the pad electrode 13D, and a black circle with /C denotes the bump electrode connected to the pad electrode 13E.

Figure 5:
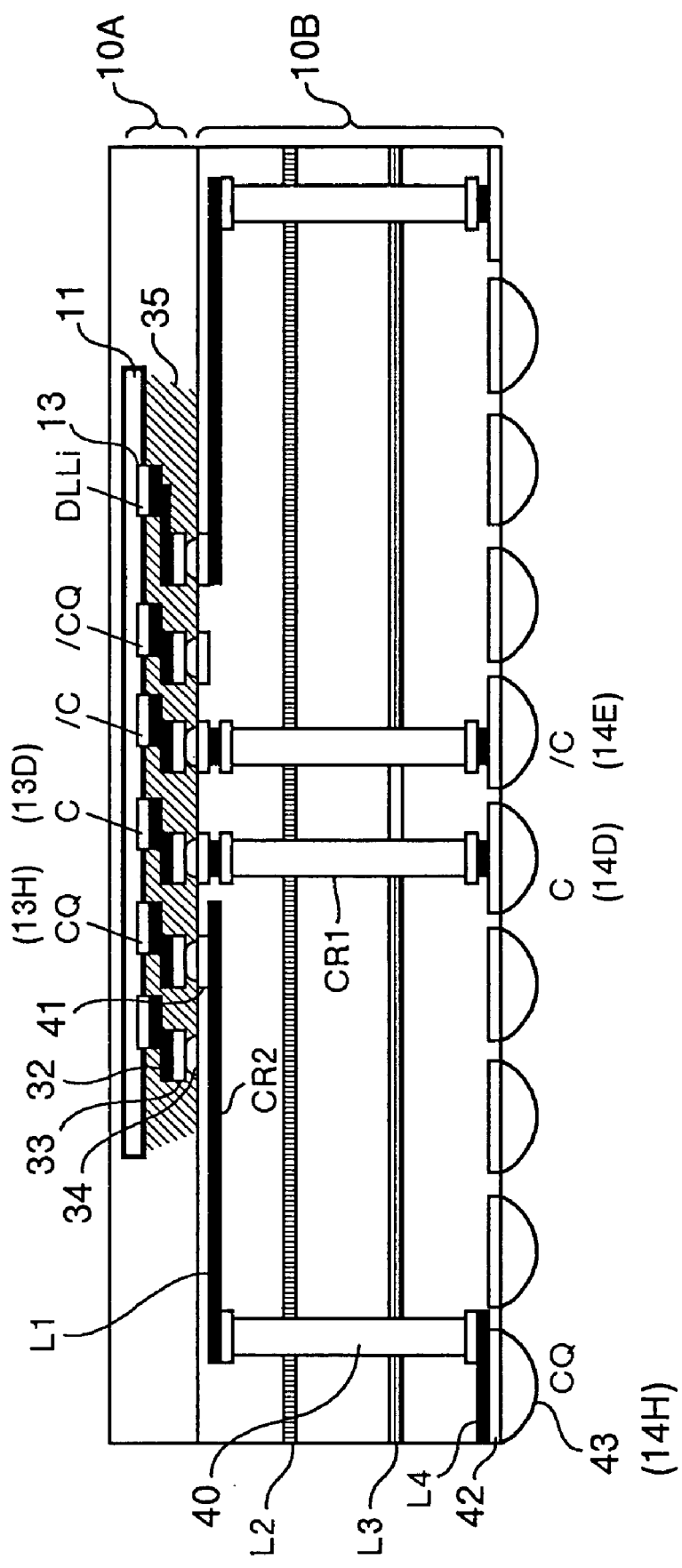
FIG. 5 is a sectional view illustrating a vertical sectional structure of the SRAM so that clock synchronization paths and the like are shown.

FIG. 5 illustrates a vertical sectional structure of an SRAM so that clock synchronization paths are shown. The section in FIG. 5 is taken roughly along a direction A in FIG. 4. The package 10 for the SRAM chip 11 is constituted from a face down mounting structure 10A and a multi-layer wiring substrate 10B of a flip chip.

Circuit elements for constituting the SRAM are formed on the semiconductor substrate made of a material such as monocrystalline silicone, and the pad electrodes 13 connected to the circuit elements are exposed on the surface of the SRAM chip 11. Like bonding pads, the pad electrodes 13 are disposed in a small area at high density. One ends of the relocation wiring 32 are coupled to the pad electrodes 13, and the other ends are distributed on the chip. The bump electrodes 34 are arranged like an array (in an area-array form) in the bump land 33 at the other ends of the relocation wiring, and the bump electrodes 34 arranged like the area array are exposed from an insulating film 35. With this arrangement, the bump electrodes 34 are arranged at larger spacings than the pad electrodes 13, thereby facilitating face down mounting.

A multi-layer wiring substrate 10B includes four conductive layers L1 to L4 insulated to one another. The conductive layer L3 constitutes a power supply plane to which a power supply voltage VDD is fed. The conductive layer L2 constitutes a ground plane to which a ground potential VSS for the circuit is supplied. The conductive layers L1 and L4 are used as wiring layers. Connection between the conductive layers L1 and L4 is performed via through holes 40. The conductive layer L1 is connected to predetermined ones of the bump electrodes 34 through their bump lands 41. The conductive layer L4 is connected to predetermined ones of the ball electrodes 43 through their ball lands 42.

In the example in FIG. 5, the ball electrodes 43 constitute the external connecting electrodes (collectively indicated by reference numeral 14) such as the external connecting electrode 14D. Referring to FIG. 5, the ball electrode 43 with CQ constitutes the external connecting terminal 14H, the ball electrode 43 with C constitutes the external connecting electrode 14D, and the ball electrode 43 with /C constitutes the external connecting terminal 14E. The pad electrode 13 with CQ constitutes the pad electrode 13H, while the pad electrode 13 with C constitutes the pad electrode 13D. A plurality of pad electrodes 13 are formed on the SRAM chip 11. An element formation layer (not shown) is formed on the surface of the SRAM chip 11 where the pad electrodes are formed.

In FIG. 5, a path CR1 from the external connecting terminal 14D (constituted from the ball electrode 43 with C) to the pad electrode 13D (constituted from the pad electrode 13 with C) (or the first portion of the second signal path) and a path CR2 from the pad electrode 13H (constituted from the pad electrode 13 with CQ) to the external connecting terminal 14H (constituted from the ball electrode 43 with CQ) (or the second portion of the second signal path) are shown as the clock synchronization paths.

Figure 6:
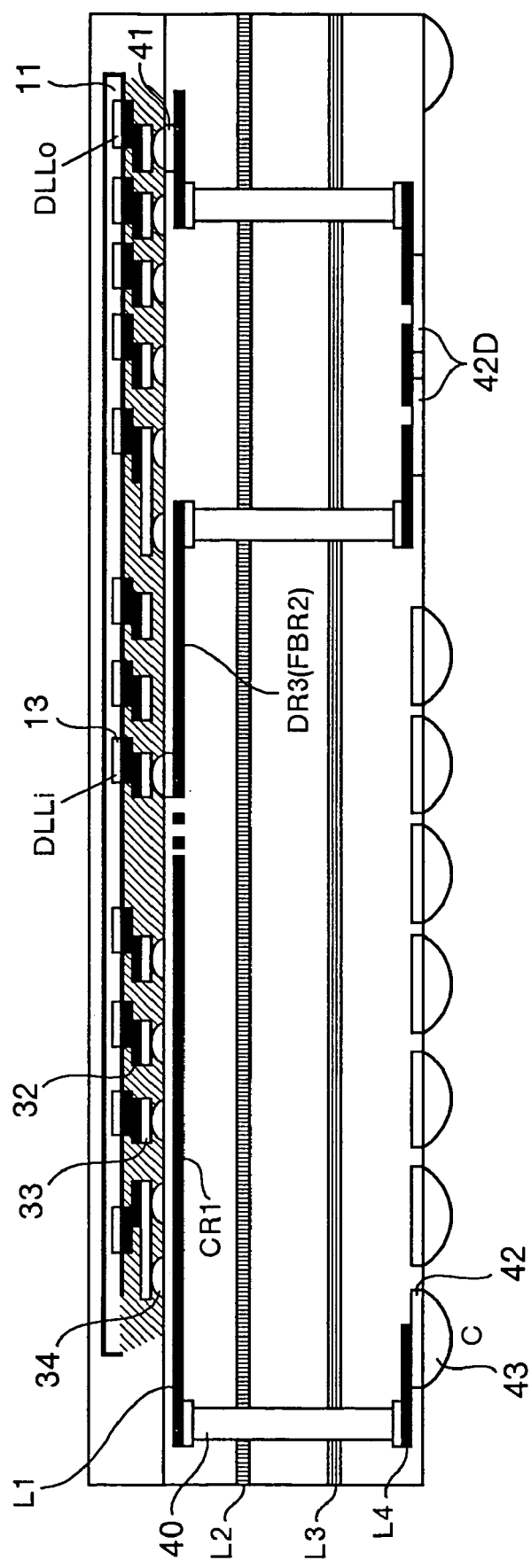
FIG. 6 is a sectional view illustrating a vertical sectional structure of the SRAM so that a feedback path FBR2 and the like are shown.

FIG. 6 illustrates a vertical sectional structure of the SRAM so that the feedback path FBR2 is shown. The section in FIG. 6 is taken roughly along a direction B in FIG. 4. Referring to FIG. 6, a path DR3 from the pad electrode 13I (the pad electrode 13 with DLLo) to the pad electrode 13J (the pad electrode 13 with DLLi) (or the first signal path) is shown as the feedback path FBR2.

The path DR3 (FBR2) in FIG. 6 becomes the replica circuit that simulates the path which is the sum of the paths CR1 and CR2 in FIG. 5, and the length of wiring and wiring elements of the path DR3 are so designed to be the same as those of the paths CR1 and CR2 as much as possible. The path DR3 (FBR2) is not connected to a ball electrode 43, but is designed to pass through dummy lands 42D.

Figure 7:
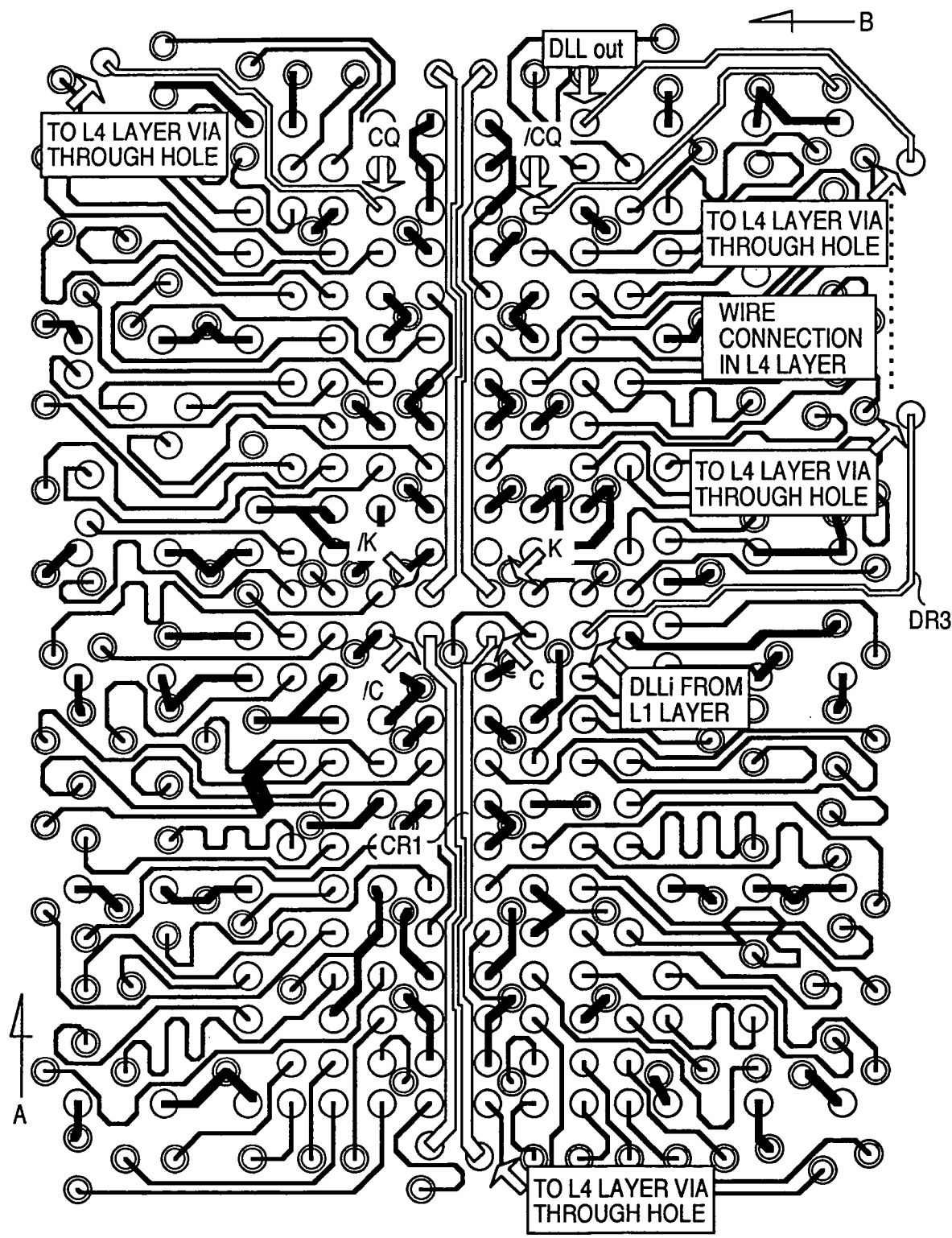
FIG. 7 is a plan view illustrating wiring paths inside a conductive layer L1 in the same direction as FIG. 4.
Figure 8:
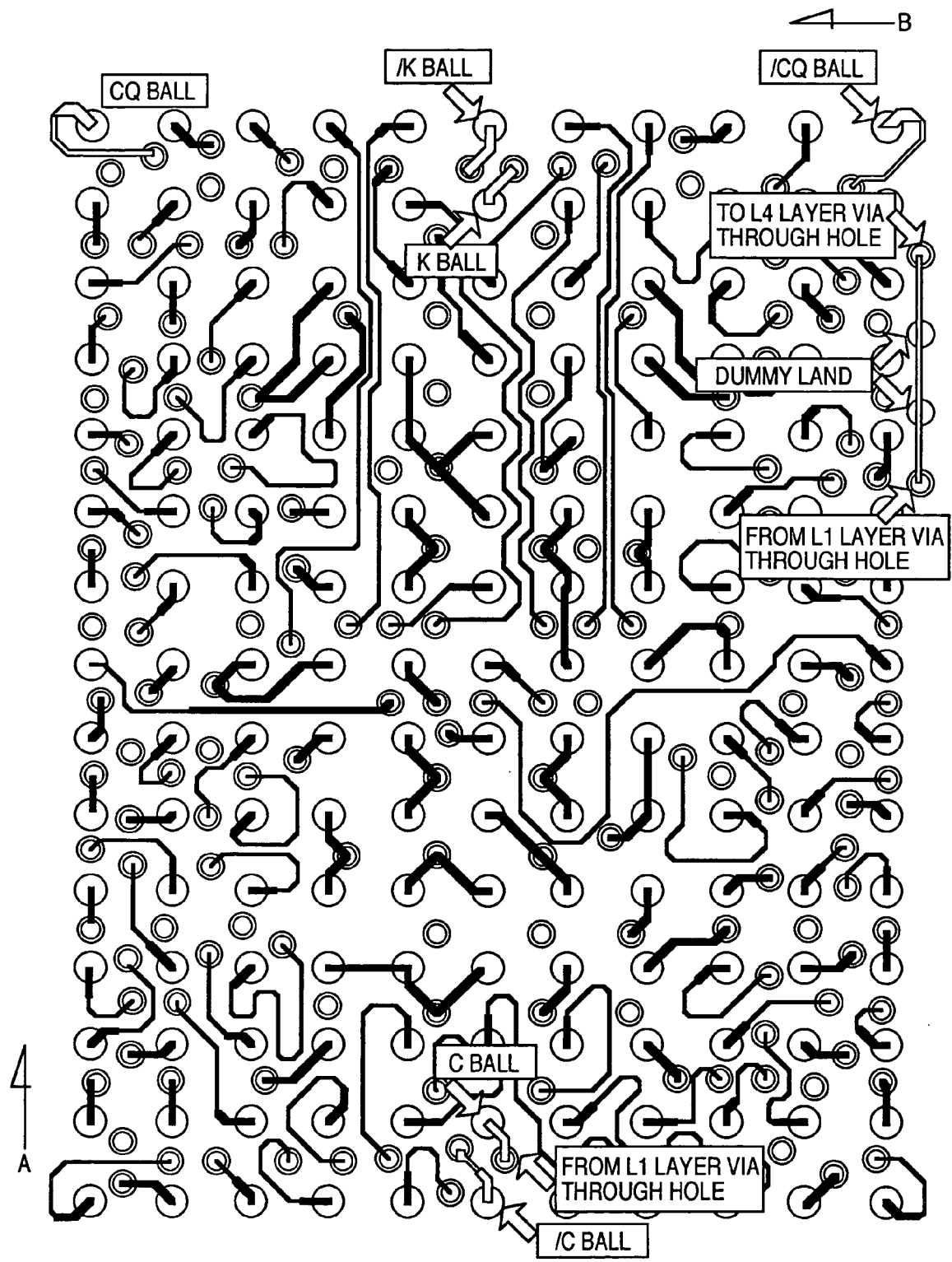
FIG. 8 is a plan view illustrating wiring paths inside a conductive layer L4 in the same direction as FIG. 4.
Figure 9:
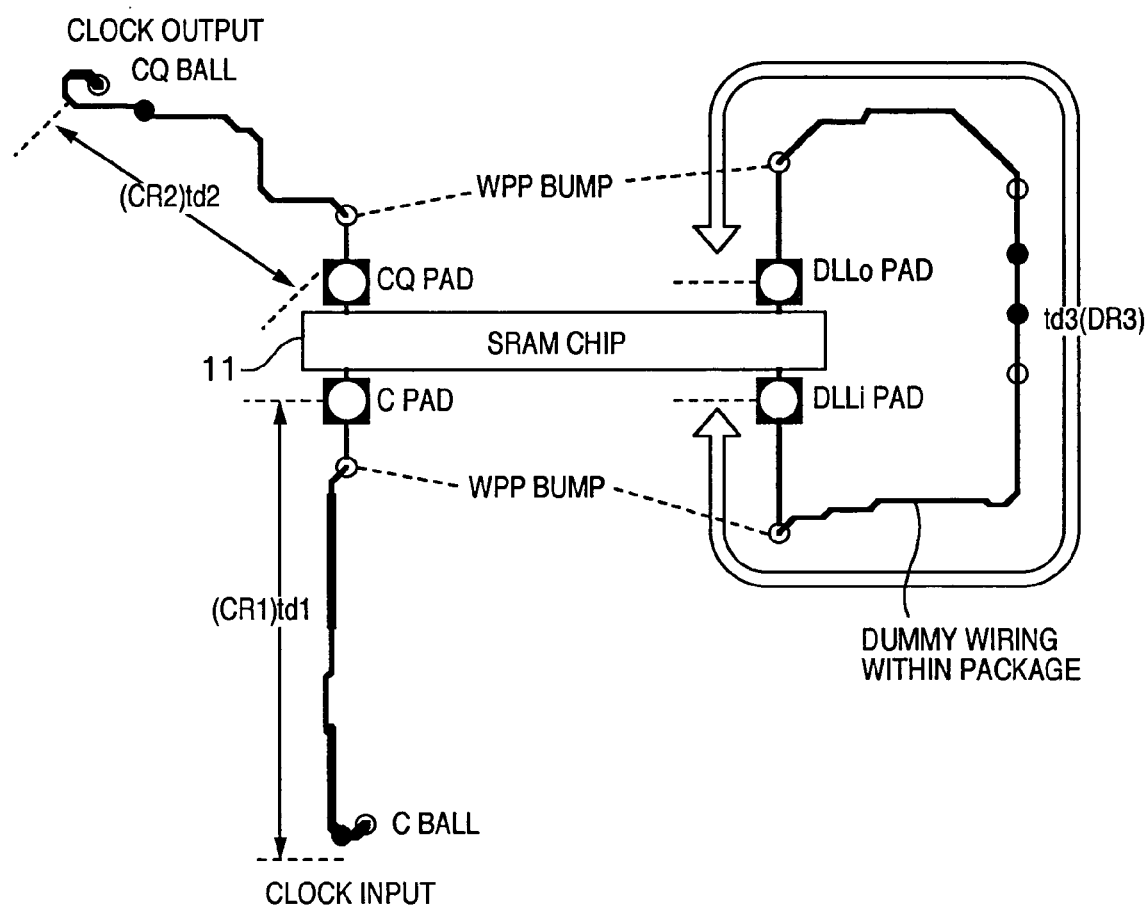
FIG. 9 is an explanatory diagram two-dimensionally showing arrangement of paths CR1, CR2, and DR3.

FIG. 7 illustrates wiring paths inside the conductive layer L1 in the same direction as FIG. 4. Likewise, FIG. 8 illustrates wiring paths inside the conductive layer L4 in the same direction as FIG. 4. The pad electrode with C shown in FIG. 4, for example, is electrically conducted from the bump electrode indicated by reference character C in FIG. 7 to the conductive layer L4 constituting the path CR1, electrically conducted to the conductive layer L4 constituting the path CR1 in FIG. 8, and then connected to the ball electrode with C BALL. FIG. 9 two-dimensionally shows arrangement of the paths CR1, CR2, and DR3. From FIG. 9, it can be seen that the wiring length of the path DR3 is also simulated and formed to be comparable to the sum of the wiring lengths of the paths CR1 and CR2. Incidentally, in FIG. 9, CQ-BALL and C-BALL denote the ball electrodes 43, CQ-PAD, C-PAD, DLLo-PAD and DLLi-PAD denote the pad electrodes 13, and WPP-BMP denote the bump electrodes 34.

Figure 10:
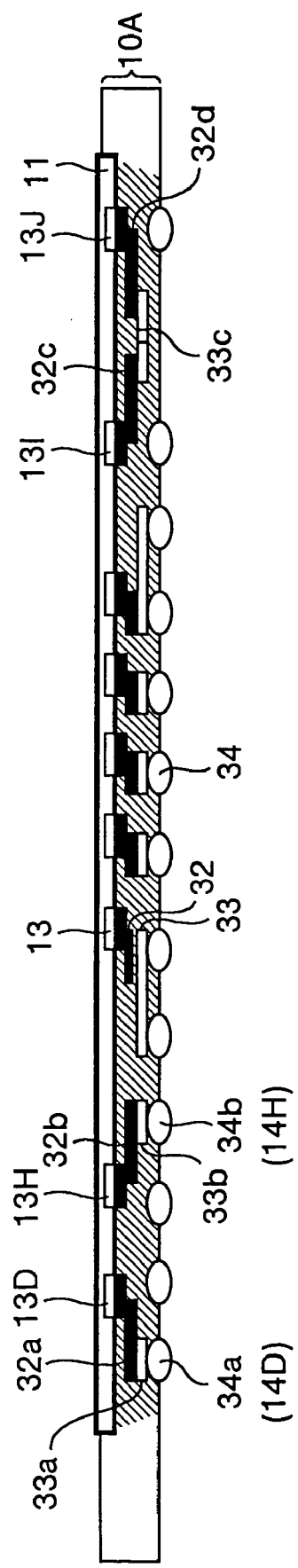
FIG. 10 is a vertical sectional view of the SRAM constituted as the flip chip.

FIG. 10 illustrates a vertical sectional structure of the semiconductor device when the package 10 is constituted only from the face down mounting structure 10A of a flip chip. In short, the SRAM 1 in FIG. 10 is constituted as the flip chip. In this example, the bump electrodes 13 are associated with the external connecting terminals 14 in FIG. 1, and are used as mounting terminals. Referring to FIG. 10, a clock input path from the external connecting terminal 14D to the pad electrode 13D is shown as a path from a bump electrode 34a to relocation wiring 32a through a bump land 33a. A clock output path from the pad electrode 13H to the external connecting terminal 14H is shown as a path from relocation wiring 32b to a bump electrode 34b through a bump land 33b. Referring to FIG. 10, the feedback path FBR2 in FIG. 1 is shown as a path from the pad electrode 13I to the pad electrode 13J through relocation wiring 32c, a bump land 33c, and relocation wiring 32d. This path simulates the delay elements in the clock input path and the clock output path. The feedback path FBR2 uses the comparatively long bump land 33c for simulating the bump electrodes 34a and 34b. In the configuration in FIG. 10, a package delay caused by the multi-layer wiring substrate does not need to be considered. Thus, a delay mismatch is all the more reduced.

According to the SRAM 1 described above, due to the on-package replica circuit, the feedback path FBR3 for clock synchronization having a good match with the components of a package delay generated from resistive components, inductance components and electrostatic capacitance components caused by the conductive layers L1 and L4, bump electrodes 13 and relocation wiring can be configured. The DLL circuit 21 with high precision, which has a less clock synchronization mismatch resulting from variations in the manufacturing process and changes in temperature can be implemented.

As described above, by adopting the DLL circuit 21 for the SRAM, the high-speed clock synchronization of the SRAM becomes possible. The SRAM can be thereby made suitable for high-speed access.

The foregoing description was specifically directed to the invention made by the inventor of the present invention, in connection with the embodiment. The present invention, however, is not limited to this embodiment alone. Various changes and modifications are possible within the spirit and scope of the invention.

The semiconductor device is not limited to the SRAM, and may be other clock synchronization memory such as a synchronous DRAM. Further, the semiconductor device may be a data processing LSI circuit on a system-on-chip or a microcomputer. The wiring substrate used for packaging is not limited to the multi-layer wiring substrate, and may be a single-layer wiring substrate. The semiconductor integrated circuit mounted on the semiconductor device is not limited to one and may be of a multi-chip structure. The semiconductor device of the present invention can be applied to various data processing systems other than a communication system such as a router.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device with a packaging circuit portion connected to a semiconductor chip, wherein
the semiconductor chip includes a plurality of pad electrodes;
the packaging circuit portion includes:
wiring connected to the pad electrodes on the semiconductor chip;
a plurality of mounting terminals; and
a first signal path for receiving a signal output from a predetermined one of the pad electrodes and transmitting the signal to other one of the pad electrodes;
said semiconductor device includes a second signal path from a predetermined one of the mounting terminals to other one of the mounting terminal via the semiconductor chip, and
the first signal path includes delay elements comparable to a delay in a first portion of the second signal path from the predetermined mounting terminal to one of the pad electrodes for input on the semiconductor chip and a delay in a second portion of the second signal path from one of the pad electrodes for output on the semiconductor chip to other one of the mounting terminals, and is disposed on a feedback path for phase comparison for synchronizing a phase of an output signal from the second signal path to a phase of an input signal to the second signal path, the second signal path extending from the predetermined one of the mounting terminals to the other one of the mounting terminals through the semiconductor chip.

2. The semiconductor device according to claim 1, wherein the first signal path is a replica circuit simulating a delay element in the first portion and a delay element in the second portion.

3. The semiconductor device according to claim 2, wherein the semiconductor chip includes a clock synchronization circuit connected to the first portion, the second portion, and the first signal path, respectively; and
the clock synchronization circuit delays the clock signal output from the mounting terminal on the second portion by predetermined cycles with respect to the signal received at the mounting terminal on the first portion, for phase synchronization.

4. The semiconductor device according to claim 3, wherein the semiconductor chip includes:
a semiconductor substrate;
a plurality of circuit elements, formed on an element formation layer on the semiconductor substrate; and
a plurality of pad electrodes formed on a surface of the element formation layer and connected to predetermined ones of the circuit elements; and
the packaging circuit portion includes a conductive layer connected to the predetermined ones of the pad electrodes and extending on the element formation layer, the mounting terminals are bump electrodes connected to the conductive layer, and the semiconductor device is configured as a flip chip.

5. The semiconductor device according to claim 4, wherein the first signal path comprises a predetermined conductive layer for connecting the predetermined one of the pad electrodes and the other one of the pad electrodes, and lands for the bump electrodes are formed in parts of the conductive layer.

6. The semiconductor device according to claim 3, wherein the semiconductor chip includes:
a semiconductor substrate;
a plurality of circuit elements, formed on an element formation layer on the semiconductor substrate; and
a plurality of pad electrodes formed on a surface of the element formation layer and connected to predetermined ones of the circuit elements; and
the packaging circuit portion includes:
a conductive layer connected to the predetermined ones of the pad electrodes and extending on the element formation layer;
bump electrodes formed over the conductive layer;
single-layer or multi-layer wiring and through holes connected to the bump electrodes; and
ball electrodes connected to predetermined ones of the single-layer wiring or the multi-layer wiring, for use as the mounting terminals.

7. The semiconductor device according to claim 6, wherein the first signal path comprises:
a predetermined conductive layer;
the bump electrodes connected to the predetermined conductive layer; and
the single-layer or multi-layer wiring and the through holes connected to the bump electrodes; and
lands for the ball electrodes are formed in parts of the single-layer or multi-layer wiring.

* * * * *